United States Patent
Barleon

Patent Number: 6,126,742
Date of Patent: Oct. 3, 2000

[54] METHOD OF DRAWING SINGLE CRYSTALS

[75] Inventor: Leopold Barleon, Weingarten, Germany

[73] Assignee: Forshungszentrum Karlsruhe GmbH, Karlsruhe, Germany

[21] Appl. No.: 09/263,480

[22] Filed: Mar. 8, 1999

Related U.S. Application Data

[63] Continuation-in-part of application No. PCT/EP97/03822, Jul. 17, 1997.

[30] Foreign Application Priority Data

Sep. 20, 1996 [DE] Germany ............ 196 38 563

[51] Int. Cl.$^7$ .................................... C30B 15/02
[52] U.S. Cl. .................. 117/37; 117/40; 117/41; 117/44
[58] Field of Search .................. 117/37, 40, 41, 117/44

[56] References Cited

U.S. PATENT DOCUMENTS 4,548,670  10/1985  Pinkhasov .

FOREIGN PATENT DOCUMENTS

| 0 454 151 | 10/1991 | European Pat. Off. . |
| 0 634 504 | 1/1995 | European Pat. Off. . |
| 1 203 822 | 1/1960 | France . |
| 2 016 101 | 10/1970 | Germany . |
| 24 16 489 | 4/1975 | Germany . |

*Primary Examiner*—Felisa Hiteshew
*Attorney, Agent, or Firm*—Klaus J. Bach

[57] ABSTRACT

In a method of drawing single crystals from a body of highly pure polycrystalline material molten by inductive heating, a solid body of the polycrystalline material is first heated by direct induction heating at a frequency >200 KHz to increase its conductivity and is then further heated by direct induction heating at a frequency <20 KHz to melt the center of the body of polycrystalline material to form a molten pool contained by a marginal solid zone of the polycrystalline material from which the single crystal is drawn.

3 Claims, 6 Drawing Sheets

METHOD OF DRAWING SINGLE CRYSTALS

This is a continuation-in-part application of international application PCT/EP97/03822 filed Jul. 17, 1997, and claiming the priority of German application 196 38 563.6 filed Sep. 20, 1996.

BACKGROUND OF THE INVENTION

The invention relates to a method of growing monocrystals from a highly pure poly-crystalline material melt.

Such a method is known in principle, for example, from D. T. J. Hurle: Handbook of Crystal Growth 2a Basic Techniques, North Holland (1994), page 102 ff.

In a crucible consisting of quartz, an amount of silicon is molten and heated to maintain the silicon in a molten state. The crucible is disposed on a graphite containment. The melt is heated by heating rods transmitting heat by radiation to the graphite and from the graphite to the quartz crucible. From the quartz crucible, heat is transferred to the melt by heat conduction. The single crystal is drawn from the melt in the usual way.

This method however has a serious disadvantage in that the crucible needs to be hotter than the melt. The excess temperature of the crucible is greater the larger the diameter of the single crystal and, consequently, of the melt bath is. With increasing diameter of the melt bath, the heat flow through the quartz crucible must be increased so that also the temperature gradient providing for the increased heat flow from the quartz crucible to the melt is increased. As a result, the crucible becomes soft and, furthermore, a reaction occurs between the crucible and the melt whereby oxygen and crucible material are transferred to the melt thereby contaminating the melt.

It is the object of the present invention to provide a method of drawings single crystals from a melt wherein, during the melting of the crystal material and the heating of the melt, the melt remains in a highly pure state.

SUMMARY OF THE INVENTION

In a method of drawing single crystals from a body of highly pure polycrystalline material molten by inductive heating, a solid body of the polycrystalline material is first heated by direct induction heating at a frequency >200 KHz to increase its conductivity and is then further heated by direct induction heating at a frequency <20 KHz to melt the center of the body of polycrystalline material to form a molten pool contained by a marginal solid zone of the polycrystalline material from which the single crystal is drawn.

By the inductive heating of the melt, the energy is applied directly to the melt volume. The outer areas of the molten mass can be maintained cooler than the center area of the bath. As a result, no contaminants are imported from the outside and radiation losses to the ambient are minimized. It also makes it possible to perform the crystal drawing process in a continuous manner.

Below, two embodiments of the invention will be described on the basis of the accompanying drawings.

DESCRIPTION OF PREFERRED EMBODIMENTS

Figure 1:
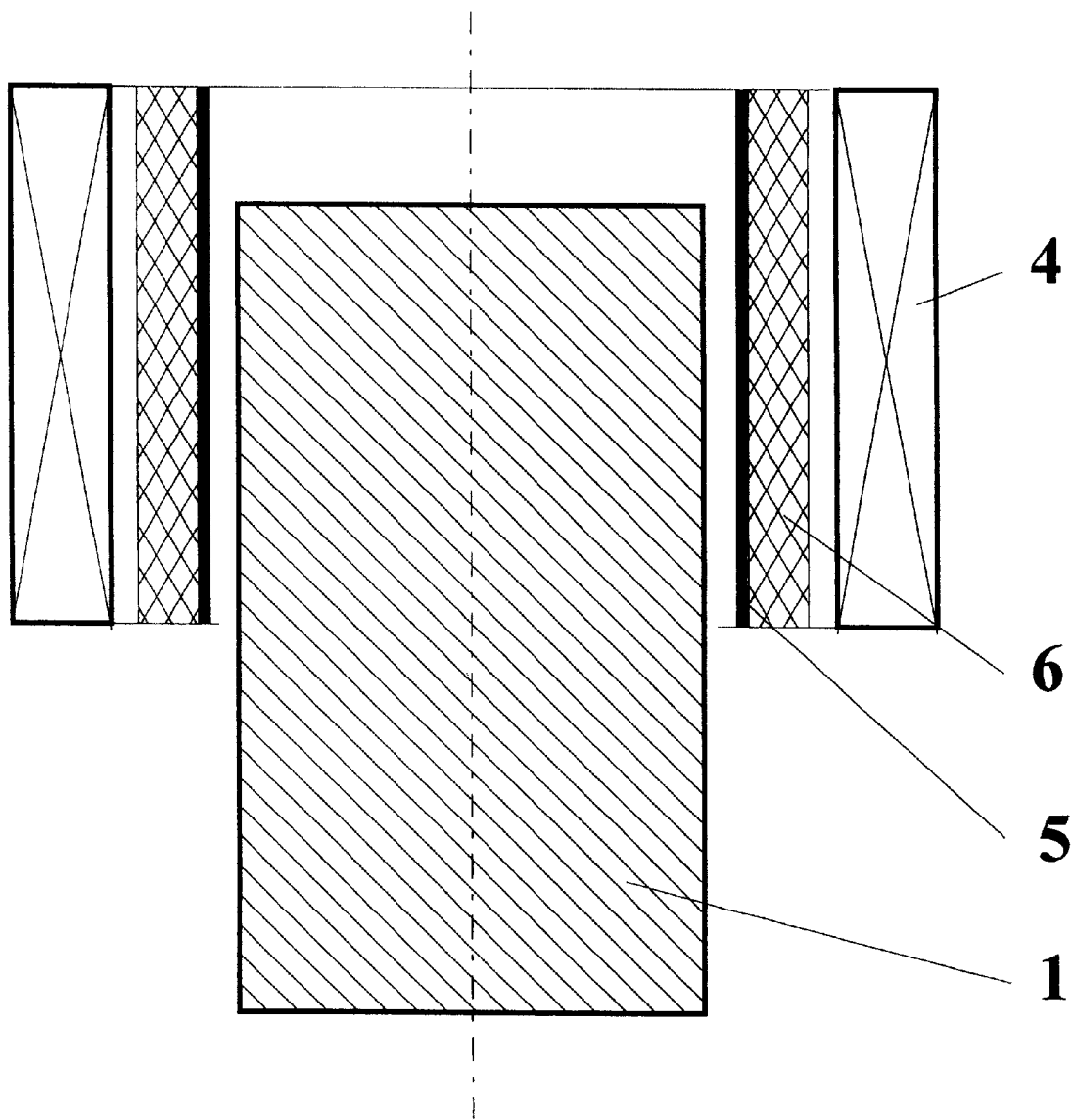
FIGS. 1 and 2 show schematically different arrangements for heating the melt.

The method according to the invention facilitates the drawing of single crystals from semiconductor materials such as silicon, germanium- and gallium- arsenide and from ion salts.

As base material, polycrystalline solid bodies (solidified melts or bodies formed by crystallization from the vapor phase) or sintered bodies and stampings may be used.

The two embodiments are different because of the different heat conductivities of the base material.

If polycrystalline solid base bodies of high heat conductivity are used, there are three possibilities for increasing the electric conductivity in the first heating stage.

FIG. 1 shows a heating arrangement for heating a polycrystalline solid body by heat radiation.

The solid body 1 is surrounded by a radiation heat source 5. The radiation heat source 5 may comprise an arrangement of electric heating rods which are distributed over the circumference of the crucible and which are retracted downwardly or otherwise removed after the heating procedure is completed. It may alternatively comprise a radiation shield consisting of a heat resistant material which is maintained at a temperature close to the melting point of the material to be melted by means of an induction coil 4. This shield heats the solid body by radiation heating with an energy of about 40 KW to a temperature which is sufficient to increase the electric conductivity of the polycrystalline solid body to such a degree that an inductive field applied thereto can input sufficient energy into the body to cause its melting. The heat losses of the heat shield to the outside can be greatly reduced by a thermally and electrically non-conductive insulation structure 6. This heat insulation structure is moved, together with the heat shield downwardly after completion of the heat-up procedure or is otherwise removed.

If the transmission frequency of the induction coil is so selected that it is sufficiently high (for silicon greater than 200 KHz) to generate also in the cold solid body more energy than is lost by radiation from its surface, the heat-up procedure by heat radiation may be eliminated. In that case, however, after reaching a temperature, which is about 100° K. below the melting point of the solid body, either the heat-up coil 4 has to be replaced by an operating coil or the frequency of the coil 4 must be reduced from >200 KHz down to <10 KHZ.

Figure 5:
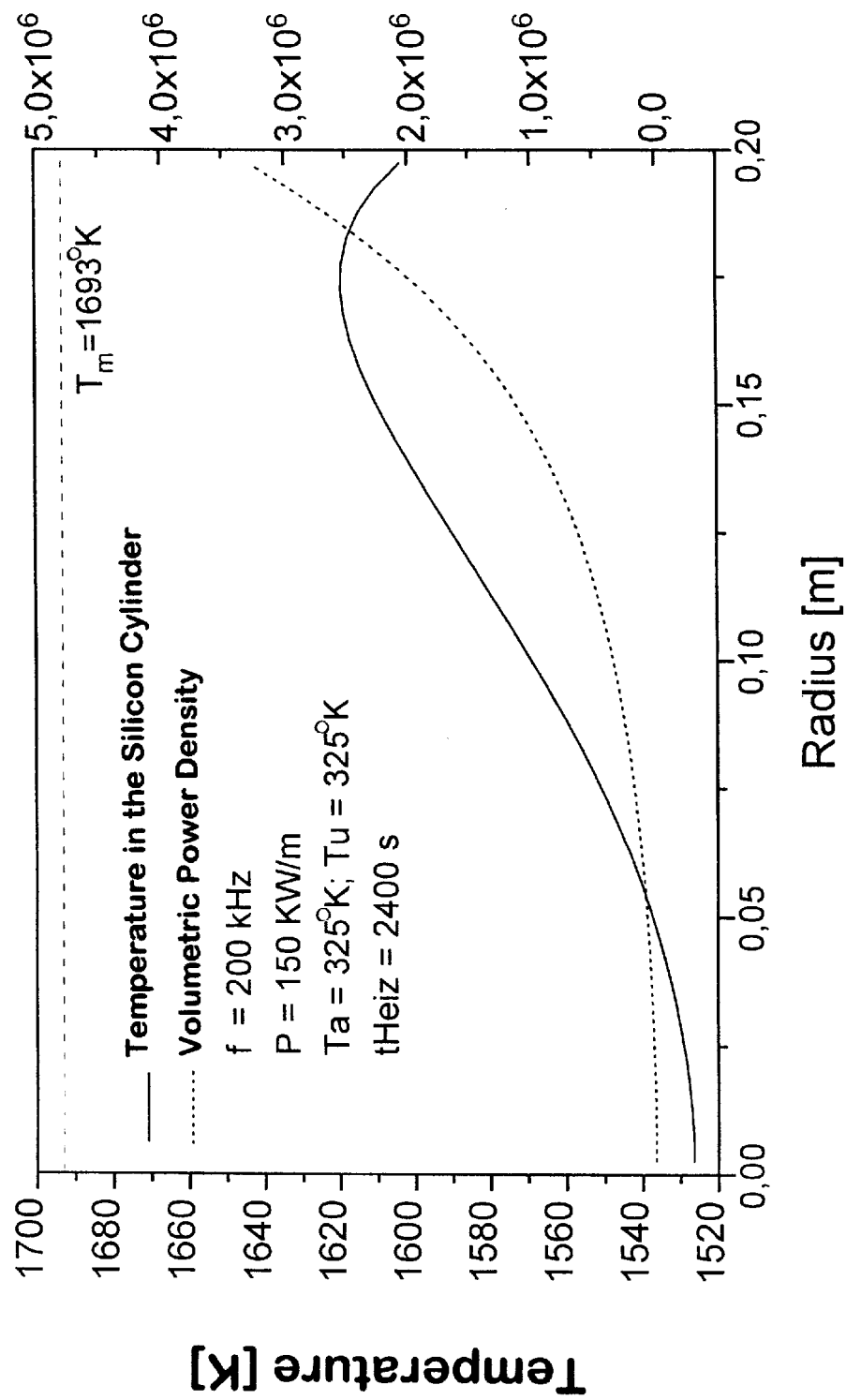
FIGS. 5 and 6 show the temperature distribution in the material melt at different induction heating frequencies.
Figure 6:
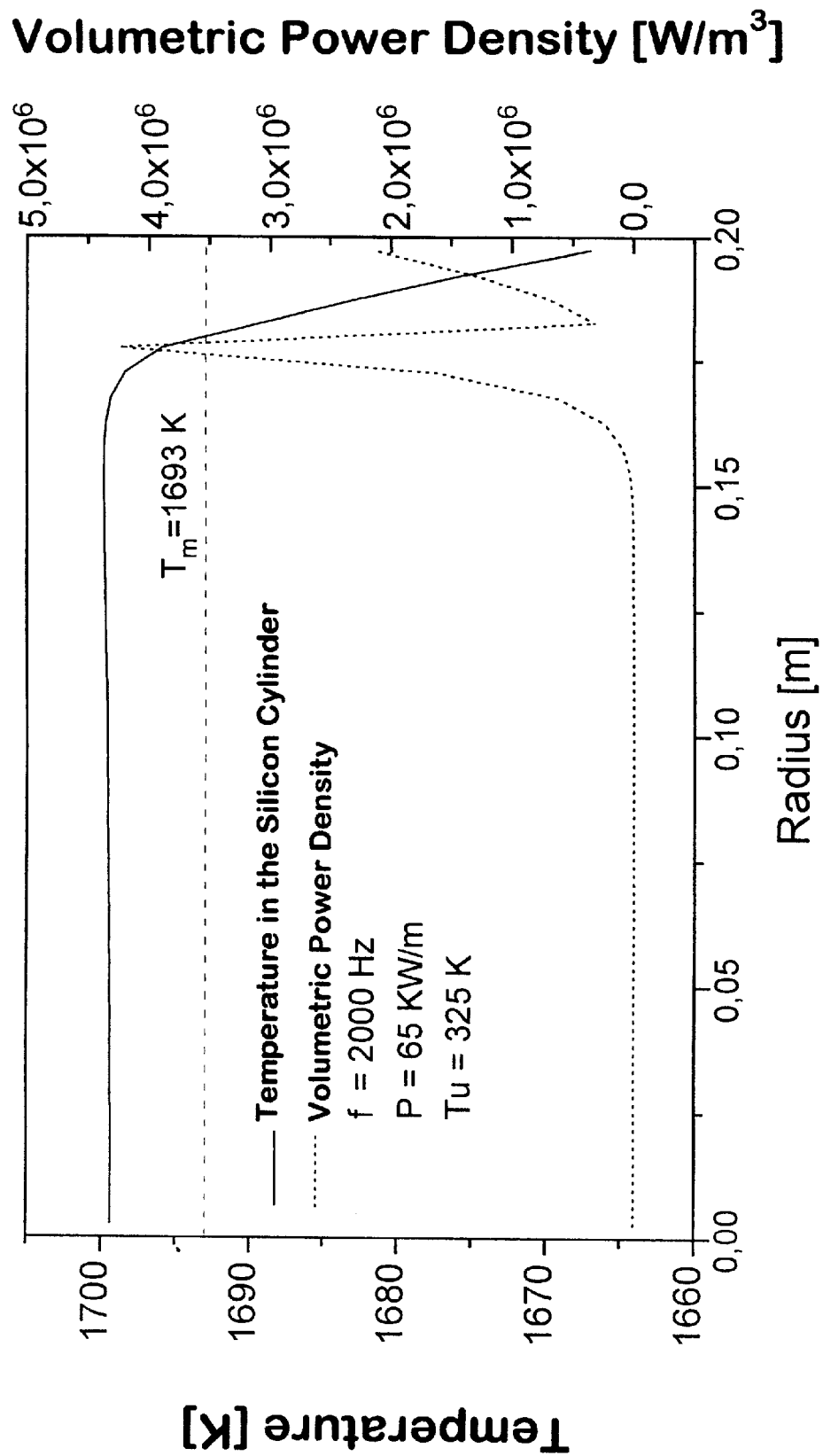

FIGS. 5 and 6 show the results of calculations for the heat-up phase and for the continuous operation of a silicon melt in a body of 0.4 m diameter.

In accordance with these calculations, a power input of 150 KW/m at a frequency of 200 KHz is applied during the heat-up phase. The dimension KW/m relates to the energy absorbed by a test body length of 1 m. When, after about 2400 seconds, a temperature in the solid body of about 100° K. below the melting point of silicon of 1693° K. has been reached, the frequency of 200 KHz is switched to 2 KHz while the energy applied remains first unchanged until the silicon in the center begins to melt. Then the energy supply is reduced to a value of about 65 KW/m which is required for continuous operation.

Figure 2:
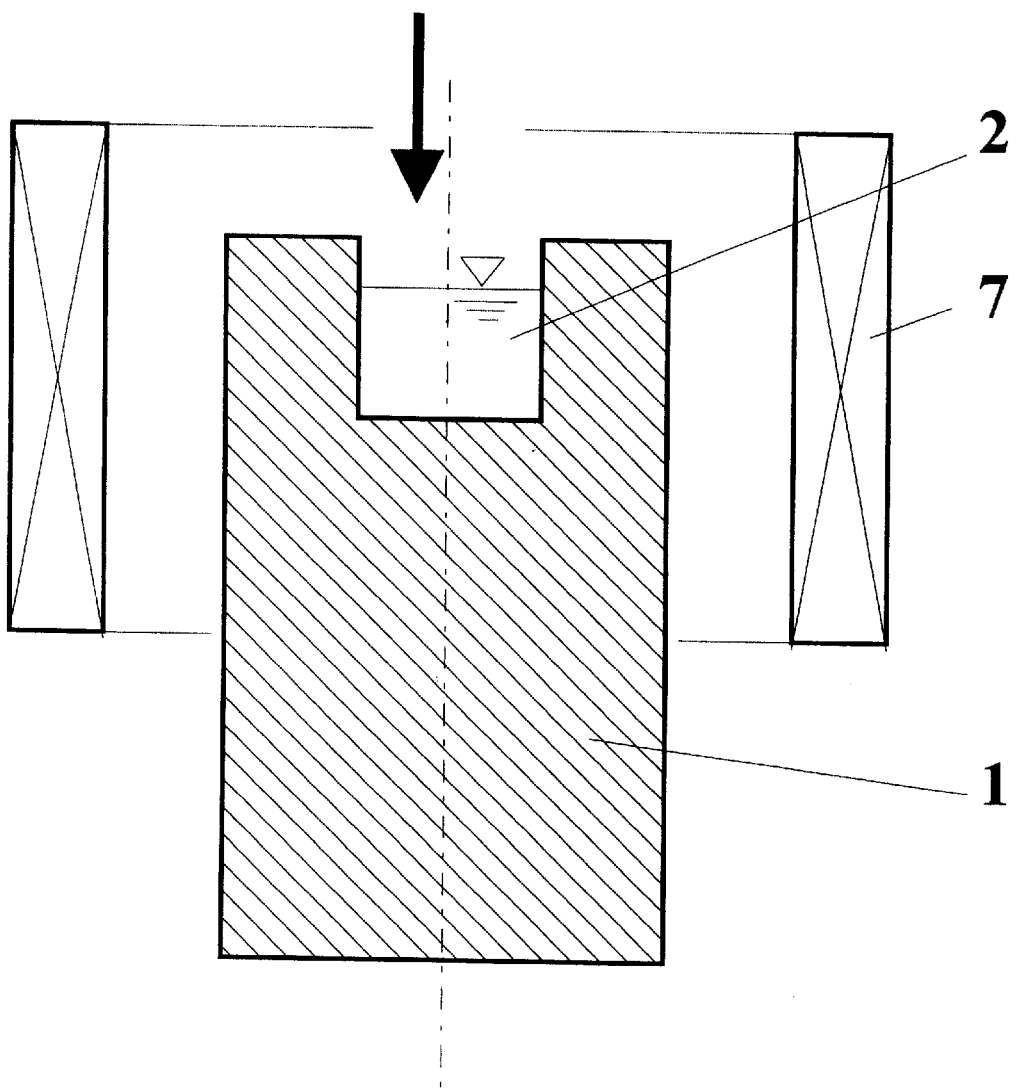

Another heat-up method or startup procedure is shown in FIG. 2. In this case, a melt 2 is supplied to a cavity in a solid body, sinter body or formed body consisting of the same material as the melt while an induction field is applied thereto. The melt 2 absorbs a greater amount of energy because of the greater conductivity of the molten material. Starting with the melt in the center, the body can be melted except for a residual colder solid crust.

In order to maintain the crust, heat must be conducted out of the crust to the ambient. With the arrangement as shown in FIG. 3, this heat can be removed only by heat radiation since the melting and drawing process is performed under a vacuum or in a cover gas atmosphere.

The amount of heat to be removed is smaller the thicker the crust is permitted to be.

With a diameter of the solid body of 0.4 m, a height of the melt bath also 0.4 m, a crust thickness of 2 cm and a drawing speed of 5 cm/h, an induction energy of about 40 KW is required. If radiation heat reflectors 8 of an electrically insulating material are arranged at the upper edge of the crust as shown schematically in FIG. 3, the crust melts completely at the top end of the body 1.

Figure 3:
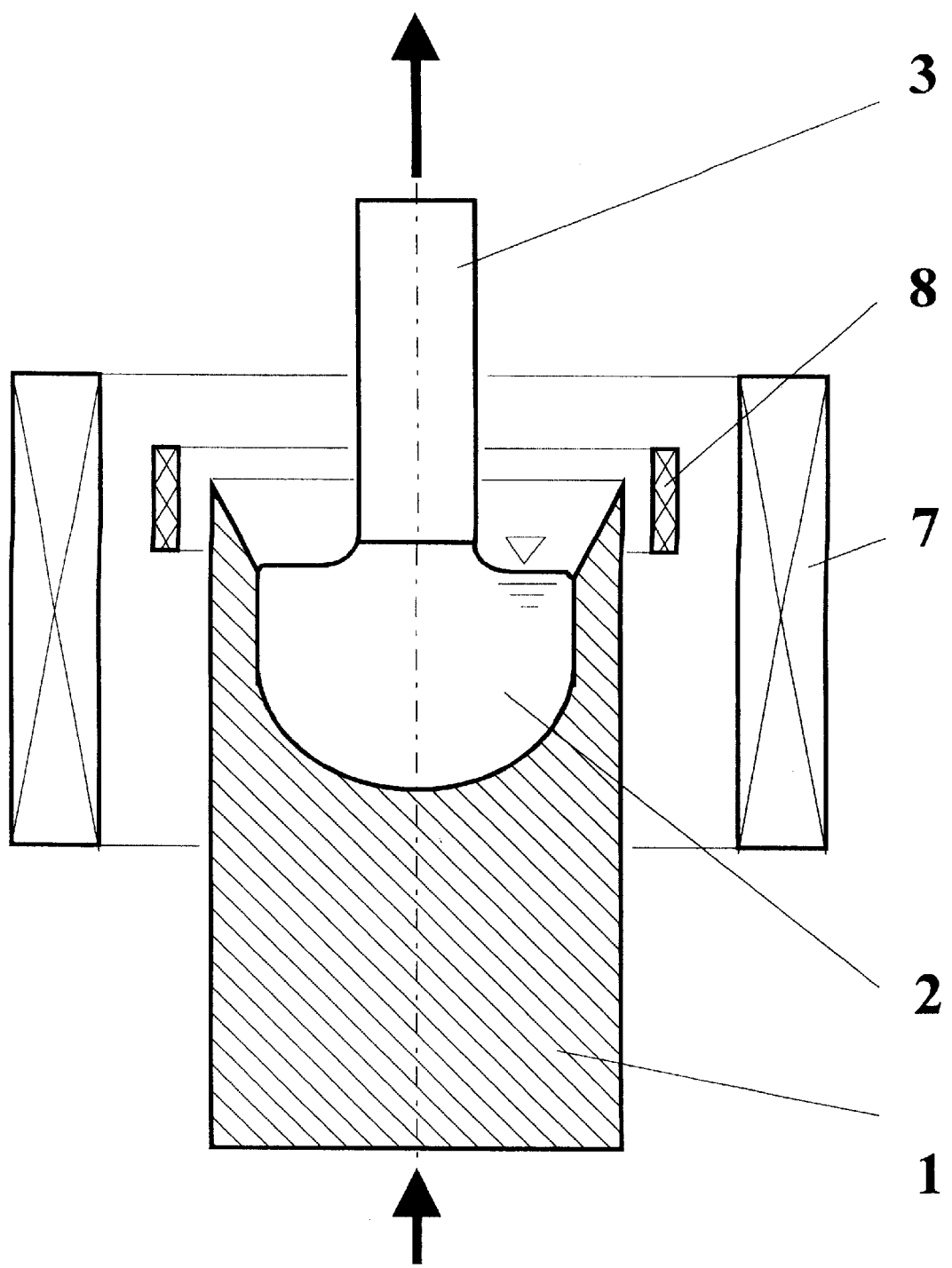
FIGS. 3 and 4 show schematically an arrangement for heating the melt in accordance with the method of the present invention.

With such an arrangement, a continuous crystal drawing procedure for drawing a crystal 3 can be obtained if, as indicated in FIG. 3 by the bottom arrow, polycrystalline material is supplied from the bottom.

The heat losses can be reduced drastically if, in place of the polycrystalline solid body, a sinter body or a pressed body of a polycrystalline material is used as the basic material.

With this type of basic material, the heat conductivity to the polycrystalline solid body is substantially reduced.

If this concept is utilized, a guide tube 9 of quartz or, respectively, sinter ceramics encloses the basic material. A piston 10 moves the body 1 upwardly in accordance with the consumption of the basic material.

The upper edge of the crust is melted because there, the cooling of outer area is less intense.

In this arrangement, the operating coil 7 is used at the same time for the cooling of the guide tube 9.

Figure 4:
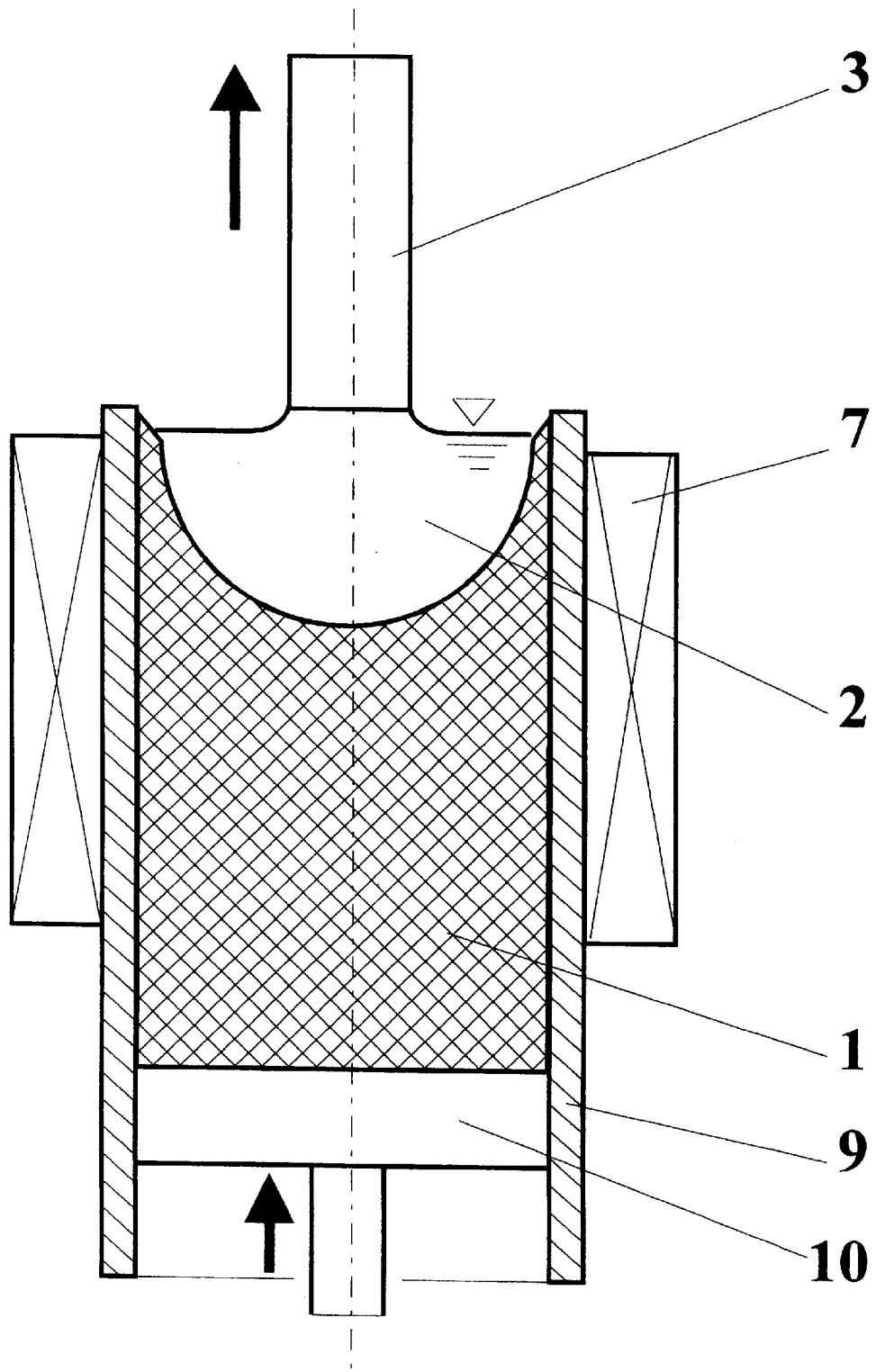

The method according to FIG. 3 and FIG. 4 is particularly suitable for the melting of ion crystals such as alkaline bromides, (NaBr, Kbr, AgBr, CuBr) alkalichlorides (LiCl, NaCl, KCl, CsCl, $CaCl_2$) alkalifluorides (LiF, NaF, KF) alkali iodides (NaI, KJ), the bromides of Ag, Cu and Sb, the chlorides of Ag, Cu and Mn, and the iodides of Ag and Sb.

In these materials, the electric and heat conductivities are greatly increased when their melting point is reached. With minimal heat radiation losses, the crystal drawing process from the melt with a crucible formed by the melt material can be performed with only a relatively low inductive heat input.

What is claimed is:

1. A method of drawing single crystals from a body of highly pure polycrystalline material molten by inductive heating, comprising the steps of:

a) heating said body of polycrystalline material in a first heating stage by direct induction heating at a frequency greater than 200 KHz to increase the electric conductivity of said body of crystalline material, and b) further heating said body of polycrystalline material by direct induction heating at a frequency of less than 20 KHz to form a melt in the top of said body of crystalline material while controlling the power input and the frequency of the induction heating in such a way that an outer marginal zone of said body of crystalline material remains solid to form a crucible containing said melt, c) drawing said single crystal from said melt and d) moving said body of crystalline material upwardly at a rate at which the polycrystalline material of said body is drawn from the melt contained in said crucible formed in the top of said body of crystalline material.

2. A method according to claim 1, wherein said induction heating frequency is reduced from >200 KHz to <20 KHz at a temperature of about 100° C. below the melting point of said polycrystalline material.

3. A method according to claim 1, wherein the frequency of the induction heating for melting part of the heated polycrystalline material is 2 KHz.

* * * * *